United States Patent
Morita

(10) Patent No.: US 6,776,324 B2
(45) Date of Patent: Aug. 17, 2004

(54) WIRE BONDING APPARATUS

(75) Inventor: Naoki Morita, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 46 days.

(21) Appl. No.: 10/307,021

(22) Filed: Nov. 27, 2002

(65) Prior Publication Data

US 2003/0098330 A1 May 29, 2003

(30) Foreign Application Priority Data

Nov. 29, 2001 (JP) ........................................ 2001-364532

(51) Int. Cl.⁷ ............................. B23K 1/06; B23K 5/20; B23K 37/00
(52) U.S. Cl. .................... 228/1.1; 228/4.5; 219/121.27; 219/122; 219/121.56
(58) Field of Search ................. 228/4.5, 1.1; 219/60 R, 219/69.1, 121.25, 121.27, 121.28, 122, 121.56

(56) References Cited

U.S. PATENT DOCUMENTS

| | | | | |
|---|---|---|---|---|
| 4,594,493 A | * | 6/1986 | Harrah et al. ............. | 219/56.22 |
| 5,214,259 A | * | 5/1993 | Terakado et al. ......... | 219/56.22 |
| 5,263,631 A | * | 11/1993 | Felber ........................ | 228/4.5 |
| 5,957,371 A | * | 9/1999 | Miyano et al. ........... | 228/180.5 |
| 5,958,259 A | * | 9/1999 | Miyano et al. ........... | 219/56.22 |

FOREIGN PATENT DOCUMENTS

| | | | | |
|---|---|---|---|---|
| GB | 2086297 A | * | 5/1982 | |
| JP | 05029374 A | * | 2/1993 | |
| JP | 05-036748 | | 2/1993 | |
| JP | 05-102233 | | 4/1993 | |
| JP | 07-176560 | | 7/1995 | |
| JP | 07-263480 | | 10/1995 | |

* cited by examiner

Primary Examiner—Stanley S. Silverman
Assistant Examiner—Colleen P. Cooke
(74) Attorney, Agent, or Firm—Koda & Androlia

(57) ABSTRACT

A wire bonding apparatus including a capillary, which allows a tip end of a bonding wire to protrude from the bottom, and a discharge electrode, which generates a spark between the electrode and the tip end of the wire by an electrical discharge; and auxiliary electrodes being disposed so as to surround the area between the tip end of the wire and the tip end of the discharge electrode. The end portion of the spark on the wire side is guided onto the axial line of the portion of the wire that protrudes from the capillary by the electric fields from the auxiliary electrodes, and the end portion of the spark on the discharge electrode side is guided onto the axial line of the discharge electrode. Dissociated ions are adsorbed on the auxiliary electrodes, preventing the discharge electrode from being contaminated.

6 Claims, 4 Drawing Sheets

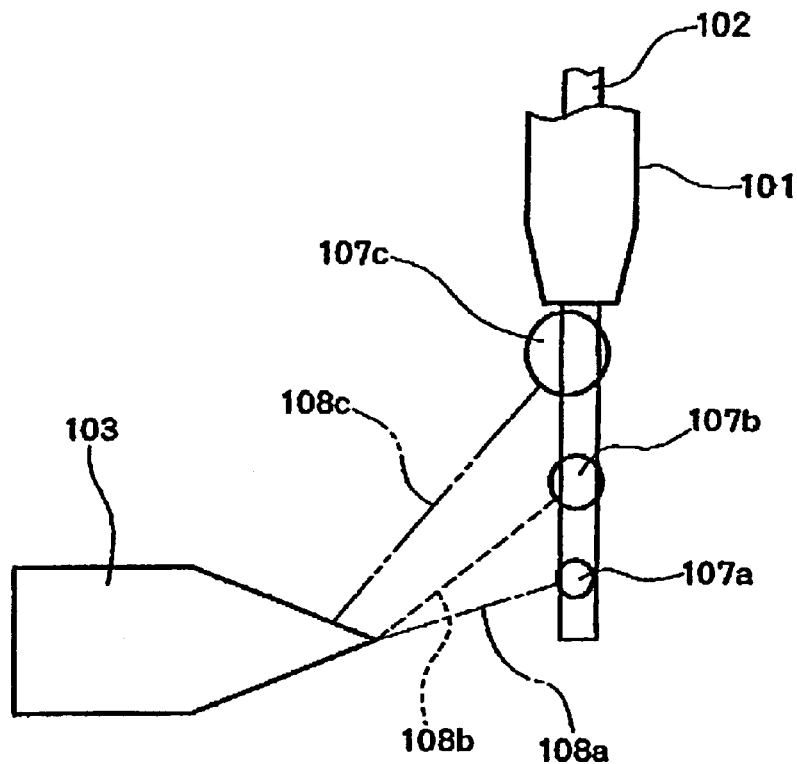
FIG. 4A
PRIOR ART
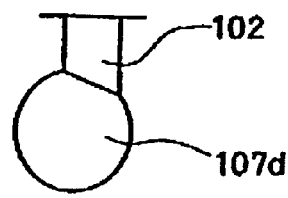 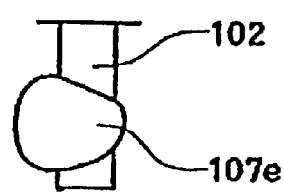
FIG. 4B
PRIOR ART
FIG. 4C
PRIOR ART

WIRE BONDING APPARATUS

BACKGROUND OF THE INVENTION

1. Field of the Invention

The present invention relates to a wire bonding apparatus and more particularly to a wire bonding apparatus that forms a ball at a tip end of a bonding wire by an electric discharge caused by applying a high voltage across the tip end of the wire and a discharge electrode.

2. Prior Art

A wire bonding apparatus is equipped with a capillary that allows a wire to pass therethrough and the tip end of the wire to protrude therefrom and a discharge electrode that is installed separately from the capillary. A spark is generated between the electrode and the tip end of the wire, so that the tip end of the wire is melted by the spark, thus forming a ball at this tip end, and the ball is bonded to an object such as an electrode, etc.

Apparatuses of this type that utilize a discharge include fixed discharge electrode systems and movable discharge electrode systems. In the fixed discharge electrode systems, the discharge electrode is fixed; and in the movable discharge electrode systems, the discharge electrode is movable by means of a solenoid, etc. An example of the fixed discharge electrode system is described in Japanese Patent Application Laid-Open (Kokai) No. 7-263480. Examples of movable discharge electrode systems are described in Japanese Patent Application Laid-Open (Kokai) Nos. 5-36748, 5-102233 and 7-176560.

In the fixed discharge electrode system, a discharge electrode is disposed so as to be on one side of the tip end of the wire protruding from the capillary. In other words, the discharge electrode is positioned as close as possible to the tip end of the wire, and there is no contact of the electrode with the capillary when the capillary is lowered. In the movable discharge electrode system, the discharge electrode is positioned directly beneath the tip end of the wire; and the discharge electrode is retracted from beneath the capillary after a discharge is performed and the ball is formed.

The fixed discharge electrode system requires, unlike the movable discharge electrode system, no driving mechanism and control mechanism that drives the discharge. Accordingly, such an apparatus has superior features. The weight of the bonding head as a whole is reduced, and an increase in operation speed is facilitated. Furthermore, the cost of the apparatus is less, and maintenance can easily be performed.

However, in this fixed discharge electrode system, as seen from FIG. 4, the discharge electrode 103 is disposed on one side of the tip end of wire 102 that passes through the capillary 101. Thus, when the discharge is performed, the spark 108a, 108b or 108c is discharged toward the wire 102 from one side of the wire 102. As a result, the tip end of the wire 102 is melted from the direction that faces the spark 106a, 106b or 106c, thus causing balls 107a, 107b and 107c to be gradually formed, and as a result, a ball 107d that is distorted or eccentric from the axial center of the wire 102 as shown in FIG. 4B is formed.

If contaminants such as ions, etc. adhere to the tip end portion of the discharge electrode 103, the discharge will occur from the side surface of the discharge electrode 103 as indicated by the spark 108c of FIG. 4A. In this case, the wire 102 begins to melt from the position of the ball 107c; as a result, the wire 102 is cut at an intermediate point, so that no ball is formed or an extremely small ball is formed. If the wire 102 is not cut at an intermediate point, a ball 107e with a distorted shape as shown in FIG. 4C is formed that will cause variation in the ball diameter.

SUMMARY OF THE INVENTION

Accordingly, the object of the present invention is to provide a bonding apparatus that assures a stable ball formation by way of correcting the path of the spark and prevents adhesion of contaminants to the discharge electrode.

The above object is accomplished by a unique structure of the present invention for a wire bonding apparatus that includes: a capillary, which allows a tip end of a wire to protrude therefrom, and a discharge electrode, which is disposed separately from the capillary and generates a spark between the electrode and the tip end of the wire by an electrical discharge, thus melting the tip end of the wire by the spark and forming a ball that is to be bonded to an object of bonding; and in the present invention, the wire bonding apparatus further includes auxiliary electrodes which generate an electric field that acts on a specified region between the tip end of the wire and a tip end of the discharge electrode, thus correcting the path of the spark by the electric field.

In this structure, the path of the spark that is generated between the discharge electrode and the tip end of the wire that protrudes from the capillary is corrected by the electric field generated by the auxiliary electrodes. Accordingly, incomplete ball formation that would be caused by the deviation of the spark path is prevented. Furthermore, the adhesion of contaminants to the discharge electrode is suppressed since foreign matters are caught by the auxiliary electrodes.

In the above structure of the wire bonding apparatus, the discharge electrode is disposed outside the moving path of the capillary, and the above-described advantages are further enhanced.

Furthermore, in the present invention, the end portion of the spark on the wire side can be guided onto the axial line of a portion of the wire that protrudes from the capillary by the electric field that is generated by the auxiliary electrodes. Accordingly, incomplete ball formation caused by deviation of the end portion of the spark on the wire side can be prevented.

Further, it can be designed so that the end portion of the spark on the discharge electrode side is guided onto the axial line of the discharge electrode by the electric field that is generated by the auxiliary electrodes. With this structure, incomplete ball formation caused by the deviation of the end portion of the spark on the discharge electrode side can be prevented.

In addition, in the bonding apparatus of the present invention, the auxiliary electrodes have the same polarity as that of the tip end of the wire or the discharge electrode. With the auxiliary electrodes having the same polarity as the tip end of the wire or the discharge electrode, the position of the end portion of the spark in the vicinity of the tip end of the wire or discharge electrode can be attracted toward the auxiliary electrodes.

Instead, the auxiliary electrodes can have a polarity that differs from the polarity of the tip end of the wire or the discharge electrode. With the auxiliary electrodes that have a different polarity than that of the tip end of the wire or the discharge electrode, the position of the end portion of the spark in the vicinity of the tip end of the wire or discharge electrode can be repelled toward the opposite side from the auxiliary electrodes.

BRIEF DESCRIPTION OF THE DRAWINGS

FIG. 4A shows the operation of prior art bonding apparatus, and FIGS. 4B and 4C are front views of balls formed by the prior art apparatus.

DETAILED DESCRIPTION OF THE INVENTION

Embodiments of the present invention will be described with reference to the accompanying drawings.

Figure 1:
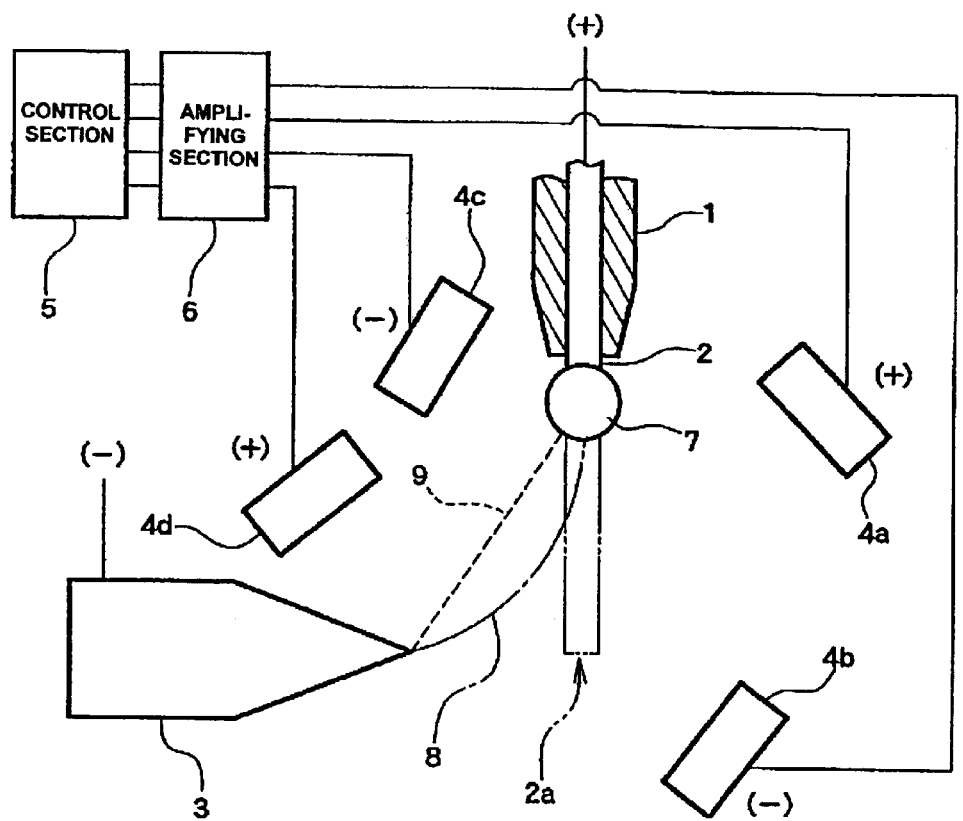
FIG. 1 shows the structure of the wire bonding apparatus according to the present invention.

In FIG. 1, the wire bonding apparatus of the shown embodiment is equipped with a capillary 1 which is a bonding tool, and a discharge electrode 3 which is installed in a position separated from the capillary 1. The discharge electrode 3 generates a spark between the electrode 3 and the tip end of a wire 2 that protrudes from the capillary 1.

The capillary 1 is held on the bonding arm of a bonding head (not shown) and is driven upward and downward by the raising and lowering movement of this bonding arm. The discharge electrode 3 is disposed outside the moving path of the capillary 1, and it is disposed on one side of the tip end portion 2a of the wire 2 that is before melting. Thus, the discharge electrode 3 is provided so that it does not interfere with the movement of the capillary 1. A power supply and a voltage regulating circuit (not shown) are connected to the wire 2 and the discharge electrode 3. The voltage is applied across the wire 2 and discharge electrode 3. The wire 2 is thus caused to function as an anode and the discharge electrode 3 is caused to function as a cathode.

Auxiliary electrodes 4a, 4b, 4c and 4d (hereafter collectively referred to as "auxiliary electrodes 4" for convenience) are disposed so that the electrodes surround the region located between the tip end of the wire 2 and the tip end of the discharge electrode 3. The auxiliary electrodes 4a and 4b are disposed so that these electrodes face the discharge electrode 3 with the axial line of the tip end portion of the wire 2 located between the auxiliary electrodes 4a and 4b and the discharge electrode 3. The auxiliary electrode 4a is adjacent to the capillary 1, and the auxiliary electrode 4b is adjacent to the discharge electrode 3. On the other hand, the auxiliary electrodes 4c and 4d are disposed in the region located between the axial line of the tip end portion of the wire 2 and the axial line of the discharge electrode 3. The auxiliary electrode 4c is adjacent to the capillary 1 and the auxiliary electrode 4d is adjacent to the discharge electrode 3.

Figure 2:
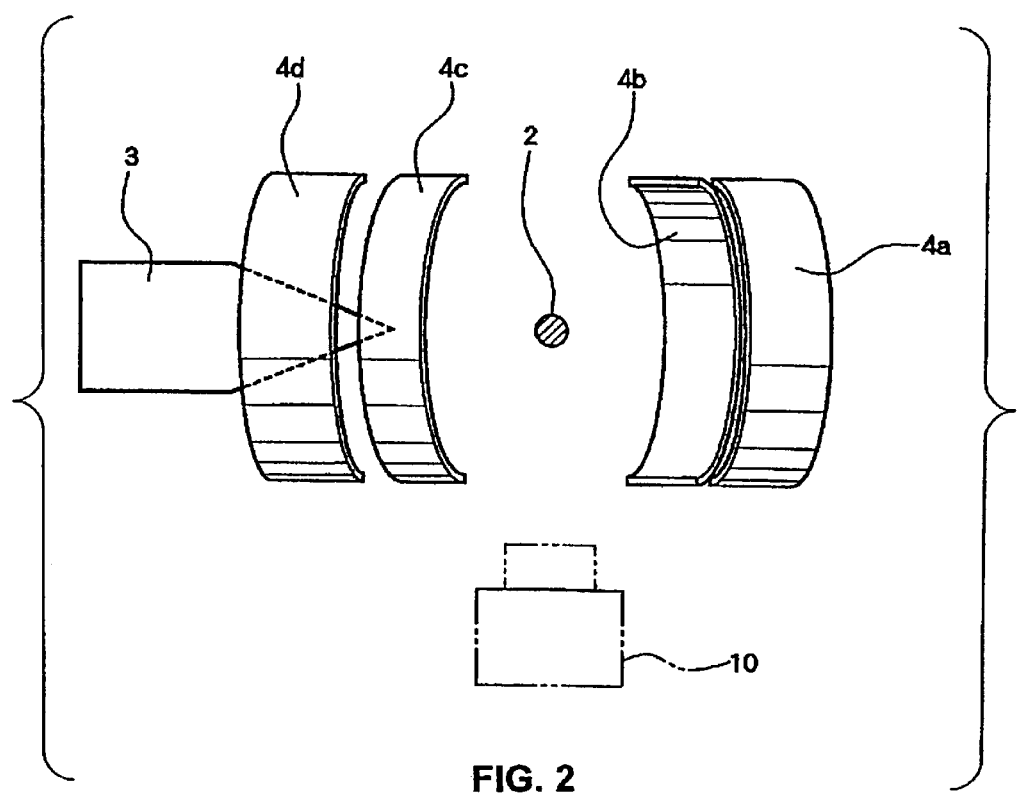
FIG. 2 is a view of the wire bonding apparatus seen from the above with the capillary omitted.

As seen from FIG. 2, the auxiliary electrodes 4 respectively are bent plate-form conductors, and insulating films are formed on the respective surfaces of the auxiliary electrodes 4.

The output of the control section 5 that controls the apparatus is connected to an amplifying section 6, and the output of the amplifying section 6 is connected to the auxiliary electrodes 4, so that the voltage that is outputted from the auxiliary electrodes 4 is controlled by the control section 5. A positive (+) voltage of the same polarity as the wire 2 is applied to the auxiliary electrodes 4a and 4d, and a negative (−) voltage of the same polarity as the discharge electrode 3 is applied to the auxiliary electrodes 4b and 4c. The voltages that are applied to the auxiliary electrodes 4 are lower than the discharge initiation voltage.

In the above construction, when a voltage that exceeds the discharge initiation voltage is applied across the wire 2 and discharge electrode 3, the molecules in the atmosphere in the region between the wire 2 and the discharge electrode 3 are dissociated into negative (−) electrons and positive (+) ions (i.e., are converted into a plasma). The negative (−) electrons are attracted to the tip end of the wire 2 which constitutes an anode, and the positive (+) ions are attracted to the tip end of the discharge electrode 3 which constitutes a cathode; as a result, a spark 8 is generated, the tip end of the wire 2 is melted by the heat of this spark 8, and a ball is formed at the end of the wire 2.

Figure 3A:
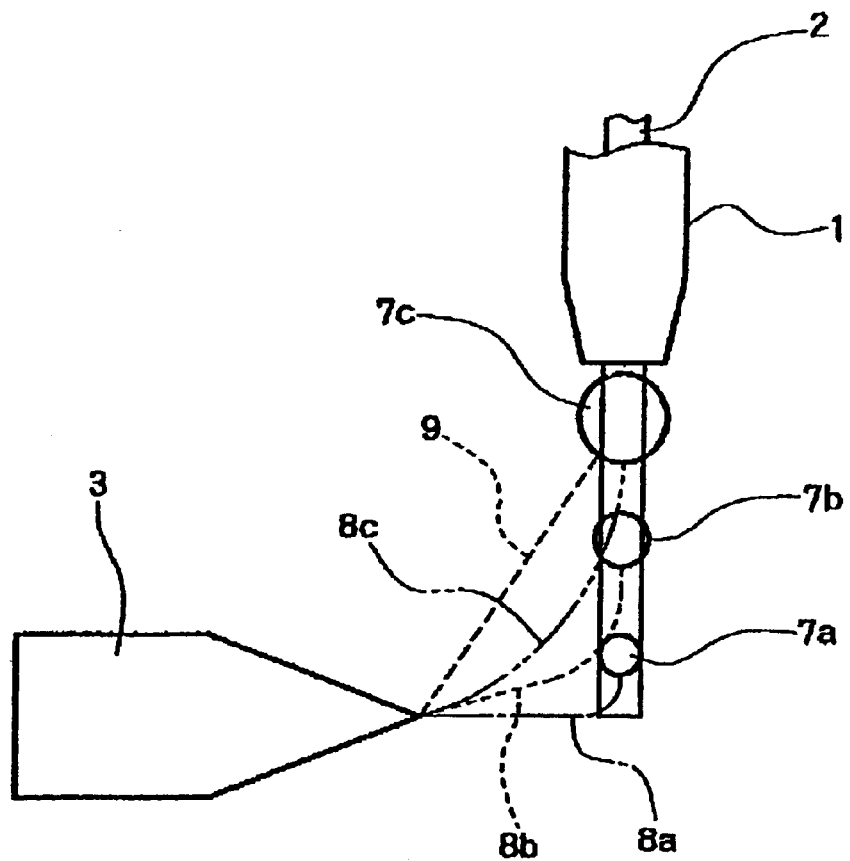
FIG. 3A shows the operation of the embodiment of the present invention.
Figure 3B:
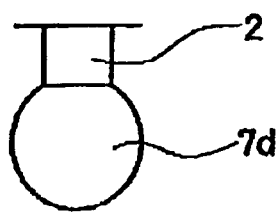
FIG. 3B is a front view of a ball formed in the embodiment.

Though in the prior art structure the spark would be formed along a rectilinear path 9 that connects the tip end of the wire 2 and the tip end of the discharge electrode 3, the path of the spark in the above embodiment of the present invention is corrected to a bent shape path 8 by the effects of the attractive force of the auxiliary electrodes 4a and 4b and the repulsive force of the auxiliary electrodes 4c and 4d. Accordingly, the end portion of the spark 8 at the wire 2 has a vertical upward orientation that substantially coincides with the axial line of the wire 2, and the end portion of the spark 8 at the discharge electrode 3 has a horizontal orientation that substantially coincides with the axial line of the discharge electrode 3. As a result, as shown in FIG. 3A, the wire 2 is melted by the heat of the spark 8a, 8b or 8c from directly below, so that balls 7a, 7b, and 7c are gradually formed and grow in this order; and as a result, a ball 7d that is not distorted or eccentric from the center of the wire 2 as shown in FIG. 3B is obtained.

Furthermore, the bent spark 8a, 8b or 8c is discharged from the position on the discharge electrode 3 that is closest to the wire 2 in the discharge path, i.e., from the tip end of the discharge electrode 3. As a result, the discharge position on the discharge electrode 3 is fixed, a stable discharge is performed, and the ball diameter is stable.

As seen from the above, in the present invention, since the end portion of the spark 8 on the wire 2 side (or the end portion of the spark 8 that is at the wire 2) is guided onto the axial line of the portion of the wire 2 that protrudes from the capillary 1 by the effects of the electric fields from the auxiliary electrodes 4a and 4c, incomplete ball formation caused by the deviation of the path of the spark 8 can be prevented.

Furthermore, the end portion of the spark 8 on the discharge electrode 3 side (or the end portion of the spark 8 that is at the discharge electrode 3) is guided onto the axial line of the discharge electrode 3 by the electric fields of the auxiliary electrodes 4b and 4d. Accordingly, incomplete ball formation caused by deviation of the end portion of the spark 8 on the discharge electrode 3 side, e.g., unstable ball formation caused by the deviation of the position of the end portion of the spark 8 on the discharge electrode 3 side from the tip end of the discharge electrode 3 toward the root end of the discharge electrode 3 is prevented. Furthermore, since the dissociated positive (+) ions are adsorbed by the effect of the electric field from the auxiliary electrode 4b, the adhesion of contaminants to the discharge electrode 3 caused by foreign matter such as the positive (+) ions, etc. is also suppressed.

Furthermore, while the intensity of the electric field created by electrodes is generally proportional to the square of the distance from the electrode, since the auxiliary electrodes 4 of the shown embodiment are formed in a plate shape, the intensity of the electric fields can be locally proportional to the distance from the auxiliary electrodes, thus facilitating design and control. Furthermore, insulating films are formed on the surfaces of the auxiliary electrodes 4, and the voltages that are applied to the auxiliary electrodes 4 are lower than the discharge initiation voltage. Accordingly, discharges between the auxiliary electrodes 4 themselves, and discharges between the auxiliary electrodes 4 and the wire 2 or discharge electrode 3, can be prevented.

In the above embodiment, the auxiliary electrodes 4 are installed in four places. However, the number of auxiliary electrodes used in the present invention is optional. As long as the electrodes are positioned so that the electrodes do not interfere with the moving path of the capillary 1, the positions of the electrodes may be set in the vicinity of the tip end of the wire 2 or in the vicinity of the tip end of the discharge electrode 3, on either the attraction side (which is on the opposite side of the axial line of the wire 2 from the discharge electrode 3) or the repulsion side (which is on the discharge electrode 3 side with respect to the axial line of the wire 2). In particular, it would be possible that only the auxiliary electrodes 4a and 4b are installed on the attraction side.

Furthermore, the voltages that are applied to the respective auxiliary electrodes 4 can be manually adjusted. It is also possible to use a construction in which such an adjustment is performed automatically. The adjustment is performed, for instance, in the following manner: a comparison is made between a current spark path and a target spark path, the current spark path being acquired by processing the image obtained by imaging the spark by a camera 10 (see FIG. 2), and the target spark path being produced by free curve drawing using, for example, the third-order spline curve method (that is executed based upon the position coordinates of the respective points located at the current tip end of the wire 2, a specified distance below the tip end of the wire 2 in the vertical direction, the tip end of the discharge electrode 3 and a specified distance on one side of the tip end of the discharge electrode 3 in the horizontal direction); and further the voltages that are applied to the respective auxiliary electrodes 4 are automatically subjected to feedback control so that the amount of deviation between the respective paths is kept within a specified range of permissible deviation.

The present invention in the above is described with reference to a wire bonding apparatus that uses the fixed discharge electrode system. However, the present invention is applicable also to a wire bonding apparatus that uses the movable discharge electrode system. In such a case as well, a stable ball formation is realized by stabilizing the path of the spark and suppressing the adhesion of contaminants to the discharge electrode.

What is claimed is:

1. A wire bonding apparatus comprising:

a capillary, which allows a tip end of a wire to protrude therefrom, and a discharge electrode, which is disposed separately from said capillary and generates a spark between said electrode and said tip end of said wire by means of an electrical discharge; and said tip end of said wire is melted by said spark, thus forming a ball at said tip end that is to be bonded to an object of bonding; wherein said wire bonding apparatus is further comprised of auxiliary electrodes which generate an electric field that acts on a specified region between said tip end of said wire and a tip end of said discharge electrode, thus correcting a path of said spark by an electric field that is generated by said auxiliary electrodes.

2. The wire bonding apparatus according to claim 1, wherein said discharge electrode is disposed outside a path of said capillary which is provided movably.

3. The wire bonding apparatus according to claim 1, wherein an end portion of said spark on said wire side is guided onto an axial line of a portion of said wire that protrudes from said capillary by said electric field that is generated by said auxiliary electrodes.

4. The wire bonding apparatus according to claim 1, wherein an end portion of said spark on said discharge electrode side is guided onto an axial line of said discharge electrode by said electric field that is generated by said auxiliary electrodes.

5. The wire bonding apparatus according to any one of claims 1 through 4, wherein said auxiliary electrodes have the same polarity as a polarity of at least one of said tip end of said wire and said discharge electrode.

6. The wire bonding apparatus according to any of claims 1 through 4, wherein said auxiliary electrodes have a polarity that differs from a polarity of at least one of said tip end of said wire and said discharge electrode.

\* \* \* \* \*